United States Patent [19]
Saitoh

[11] Patent Number: 6,156,617
[45] Date of Patent: Dec. 5, 2000

[54] METHOD OF MANUFACTURING SEMICONDUCTOR DEVICE

[75] Inventor: Naoto Saitoh, Chiba, Japan

[73] Assignee: Seiko Instruments Inc., Japan

[21] Appl. No.: 09/320,113

[22] Filed: May 26, 1999

[51] Int. Cl.[7] .................................................. H01L 21/331
[52] U.S. Cl. ........................ 438/309; 438/335; 438/341
[58] Field of Search .................................... 438/309, 316, 438/317, 335, 340, 341, 350

[56] References Cited

U.S. PATENT DOCUMENTS 5,254,486  10/1993  Alter .
5,719,082   2/1998  Violette ..................................... 438/309
5,976,940  11/1999  Gomi et al. .............................. 438/340
5,994,162  11/1999  Burghartz et al. ....................... 438/309

*Primary Examiner*—Trung Dang
*Attorney, Agent, or Firm*—Adams & Wilks

[57] ABSTRACT

When a bipolar transistor having a buried layer is formed, the withstanding pressure of the bipolar transistor is deteriorated by upward diffusion to a great extent from the buried layer. When a buried layer is formed in a semiconductor substrate, by providing a region without impurity introduction, upward diffusion from the buried layer is controlled to prevent deterioration in the withstanding pressure.

33 Claims, 3 Drawing Sheets

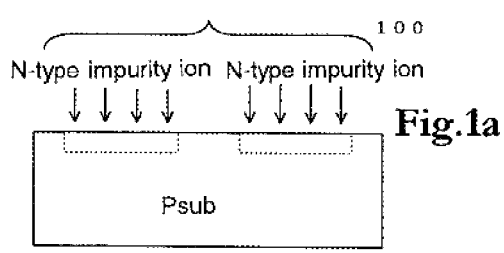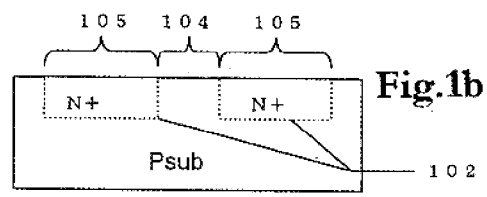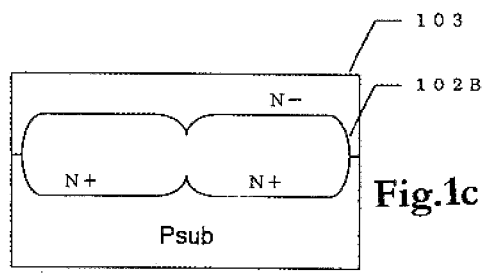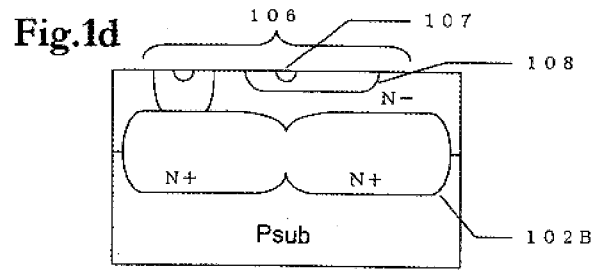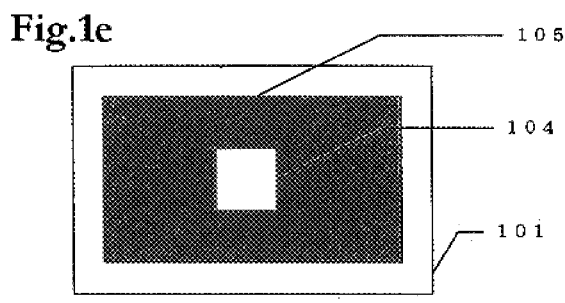

PRIOR ART

METHOD OF MANUFACTURING SEMICONDUCTOR DEVICE

BACKGROUND OF THE INVENTION

The present invention relates generally to a method of manufacturing a semiconductor device and, more particularly, to a method of manufacturing a semiconductor device more having a semiconductor substrate using an epitaxial growth film in which a bipolar transistor is formed.

Conventionally, in the entire region of or a limited part of a semiconductor substrate using an epitaxial growth film, a buried layer is often provided below the epitaxial growth film. The buried layer is used to lower the ON resistance of a device formed above the buried layer in the epitaxial film as well as to suppress parasitic elements and to improve the soft error and latch-up tolerance of the device.

The buried layer is typically formed by heavily doping impurity in the entire region or a part of the semiconductor substrate and by annealing the doped semiconductor substrate in a thermal diffusion furnace. When an epitaxial growth film is formed on a semiconductor substrate having a buried layer, the impurity in the buried layer is diffused into the epitaxial growth film by solid phase diffusion and autodoping. Then, further diffusion into the epitaxial growth film is carried out by various thermal processes for forming a device in subsequent steps, which is well known.

FIGS. 3a–3d are sectional view of a semiconductor substrate having a buried layer using an epitaxial growth film according to a conventional method of manufacturing a semiconductor device.

A buried layer 114 of an N conductivity type is formed in a silicon semiconductor substrate 101 FIGS. 3a and 3b, and an epitaxial growth film 113 is formed on the silicon semiconductor substrate 101 (FIG. 3c). Impurities in the buried layer 114 are diffused into the epitaxial growth film 113 by solid phase diffusion and autodoping during the formation of the epitaxial growth film 113. Further, the amount of diffusion of the impurity in the buried layer 114 into the epitaxial growth film 113 is increased by various thermal processes performed during the formation of a device in the surface of the epitaxial growth film 113, and thus, it is not easy to decrease the amount of diffusion. The buried layer 114 finally becomes a buried layer 114B. If the amount of diffusion from the buried layer 114B is large, a collector heavily doped region approaches a base region 108 of a bipolar transistor 106 formed thereon, which leads to deterioration in the withstanding pressure. Therefore, when a transistor with high withstanding pressure is prepared, the formed epitaxial growth film 113 has to be made thicker accordingly.

When a bipolar transistor 106 is formed with a buried layer as a part of a collector region, various thermal processes cause the buried layer to expand upward into the epitaxial layer. This makes the buried layer approach a base region too much, which sometimes makes the withstanding ability of the bipolar transistor lower than a desired value. It has of course, been taken into consideration that thickening of the epitaxial growth film is a viable method of increasing the distance between the buried layer and the base region. However, this makes it difficult to form an isolation region. This is because the isolation region is formed by coupling the buried layer and a well region by means of diffusion from the bottom and from the top, respectively. The larger the epitaxial thickness becomes, the more difficult it becomes to form the isolation region.

It may also be taken into consideration that the smaller the less the expansion of the layer the dose in the epitaxial layer. However, the smaller it becomes, the more likely it becomes to cause variation in the concentration when autodoping is carried out during the time the epitaxial layer is grown, and thus the control is difficult.

SUMMARY OF THE INVENTION

In order to solve the above-mentioned problem, the present invention uses the following means.

When an impurity is implanted into a specific region of a semiconductor substrate for the purpose of forming a buried layer, a region without impurity introduction is provided directly below an emitter region of a bipolar transistor formed in the substrate. Alternatively, by appropriately patterning a region without impurity introduction, diffusion from the buried layer into an epitaxial layer, which causes deterioration in the withstanding ability, is suppressed. By adjusting with patterning only a part of the buried layer, a device with no increase in the epitaxial film thickness, variably no increase in the resistance of a collector region, and with almost no influence of a parasitic bipolar, can be fabricated with no increase in the number of steps.

BRIEF DESCRIPTION OF THE DRAWINGS

FIGS. 1(a)–1(e) are schematic sectional views and a plan view illustrating an embodiment of a semiconductor device prepared according to a method of manufacturing a semiconductor device of the present invention.

DETAILED DESCRIPTION OF THE INVENTION

Figure 2A:
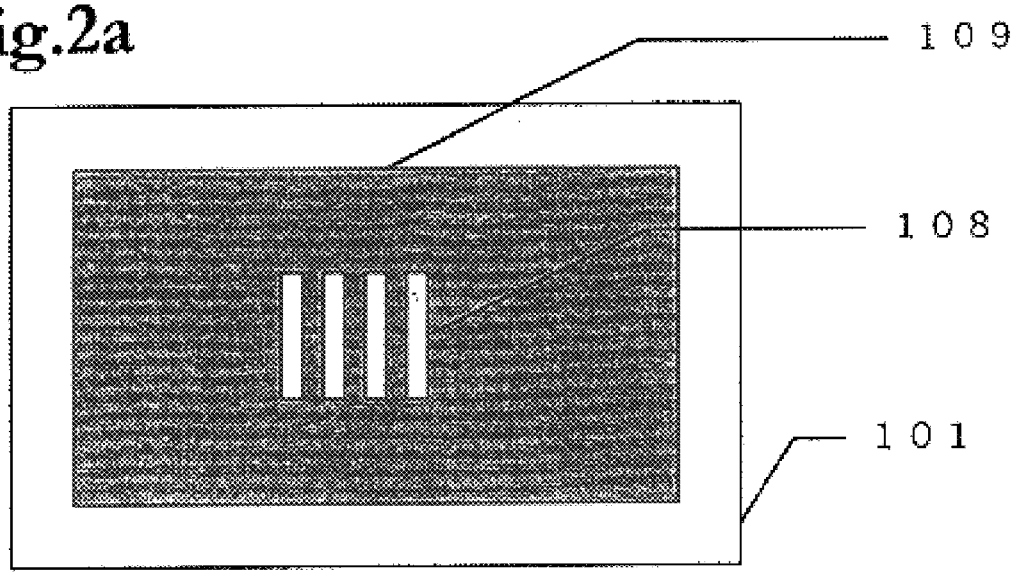
FIGS. 2(a) and 2(b) are schematic plan views illustrating other embodiments of a semiconductor device prepared according to a method of manufacturing a semiconductor device of the present invention.
Figure 2B:
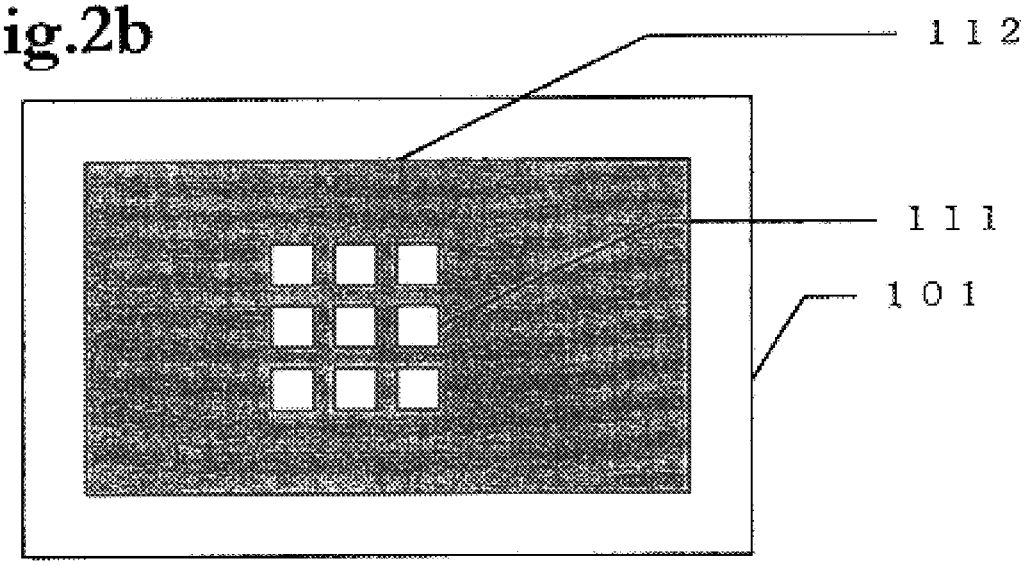
Figure 3A:
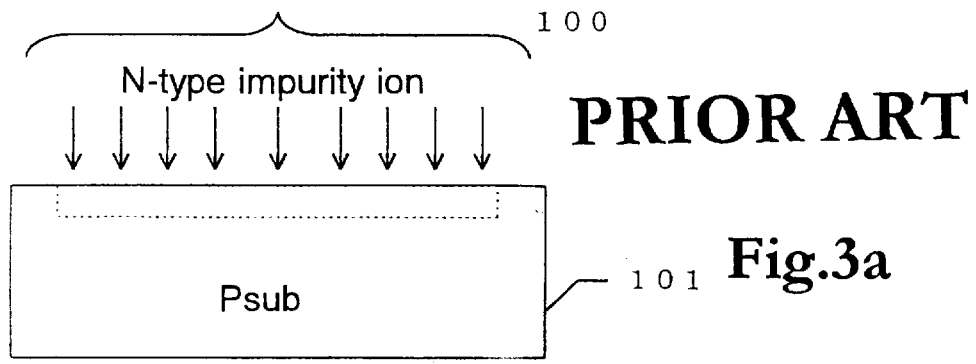
FIGS. 3(a)–3(d) are sectional views in the order of process illustrating a conventional method of manufacturing a semiconductor device.
Figure 3B:
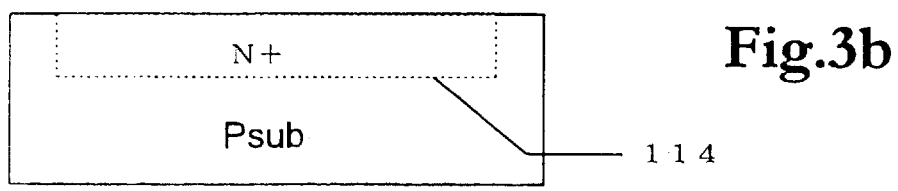
Figure 3C:
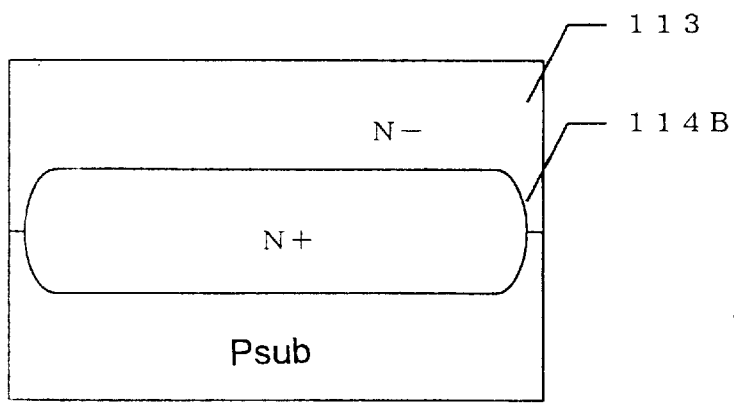
Figure 3D:
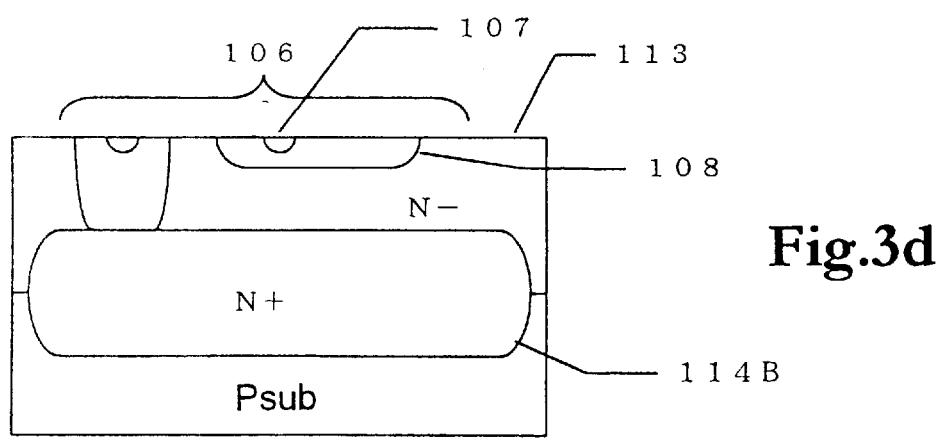

Hereinafter, embodiments of the present invention are described with reference to the drawings.

FIGS. 1(a)–1(d) are schematic sectional views illustrating an embodiment of a semiconductor device according to a method of manufacturing of the present invention and a plan view (e) of the device shown in the step shown by the sectional view (b).

Impurities of an N conductivity type, for example, arsenic, are introduced into a general specific region of a region 100 of a substrate in which a bipolar transistor 106 is formed in a later step on a silicon semiconductor substrate 101, for example, a silicon semiconductor substrate of a P conductivity type having a resistivity of 20–30 Ω·cm such that the concentration is $1\times10^{16}$ atoms/cm$^3$–$1\times10^{21}$ atoms/cm$^3$. Here, a region 104 without the impurity introduction is provided in a portion of a region 105 provided with the impurity introduction. The region 105 in which impurity is introduced is formed to surround the region 104 provided without the impurity introduction. In other words, a window 104 without the impurity introduction is left inside the region in which impurities are introduced. For example, the formation is as shown in FIG. 1(e). The region 104 without the impurity introduction is just below an emitter region 107 of the bipolar transistor 106 formed in a later step. Preferably, the area of the region 104 is larger than that of the emitter region 107. This is provided here for the purpose of making wider a substantial collector lightly doped region of the bipolar transistor 106. The dose of the introduced impurity is preferably $1\times10^{19}$ atms/cm$^3$–$5\times10^{20}$ atms/cm$^3$, and more preferably, $1\times10^{21}$ atms/cm$^3$ for the purpose of decreasing the ON resistance of a device to be formed in an epitaxial growth film 103 as well as suppressing parasitic elements and improving the soft error and latch-up tolerance. The impurity is diffused into the silicon substrate 101 by annealing. Further, the epitaxial growth film 103 is formed on the silicon semiconductor substrate 101, for example, a CVD epitaxial growth film of the N conductivity type having a resistivity of 2 Ω·cm and a film thickness of 8 μm is formed using SiH$_2$Cl$_2$ and PH$_3$ as the gas sources. In the steps heretofore, the introduced impurity is diffused into the silicon semiconductor substrate 101 and into the epitaxial growth film 103 by solid phase diffusion and autodoping during formation. Impurity above a certain concentration is distributed also in the region 104 where the impurity has not been doped and which is surrounded by the region 105 with the impurity introduction. When the bipolar transistor 106 is finally formed, the profile of a buried layer 102 is as shown by 102B in FIG. 1(c). It is preferable that the peak concentration of the impurity in the center of the region 104 without the impurity introduction is more than $5\times10^{16}$ atms/cm$^3$. This is because, if the concentration here is low, the influence of the parasitic bipolar to appear becomes great. As described above, compared with one having a similar epitaxial growth layer thickness, since the distance between a base region and the buried layer 102B just below the emitter region 107 is increased, higher withstanding ability characteristics can be expected. The distance between the base region 108 and the buried layer 102B just below the emitter region 107 can be freely varied by adjusting the area of the region 104 without the impurity introduction.

Further, when the shapes of regions 109 and 111 without the impurity introduction are set as shown in schematic plan views of FIGS. 2(a) and (b) illustrating other embodiments, by adjusting in various ways the area of the regions 109 and 111 provided without the impurity introduction and the intervals of the regions 109 and 111 without the impurity introduction, the distance between the base region 108 and the buried layer 102B just below the emitter region 107 and the area of a region where the distance can be greatly increased and freely varied.

Though, here, bipolar transistors of a vertical NPN type are described as the illustrative embodiments, the present invention is also applicable to transistors of a vertical PNP type. Further, the present invention can be applied not only to vertical type bipolar transistors but also to horizontal type bipolar transistors.

As described above, in a method of manufacturing a semiconductor device according to the present invention, by adjusting the patterning of impurities to be doped into a silicon semiconductor substrate, a bipolar transistor with high withstanding ability and satisfactory characteristics can be manufactured with satisfactory controllability, without requiring increasing the epitaxial growth film thickness and without additional processes. Further, it is also possible to reduce the damage to a buried layer due to doping of the impurity into the semiconductor substrate, which may cause fatal deterioration in the characteristics of the device.

What is claimed is:

1. A method of manufacturing a semiconductor device comprising a bipolar transistor having a collector formed in a substrate layer formed of a semiconductor material of a first conductivity type, the method comprising the steps of:

doping an impurity of a second conductivity type in a specific region on an upper surface of the semiconductor substrate layers;

diffusing into the semiconductor substrate the impurity of the second conductivity type doped in the semiconductor substrate layers;

forming an epitaxial growth layer of the second conductivity type on the upper surface of the semiconductor substrate layer; and forming the bipolar transistor in the epitaxial growth layer;

wherein the specific region of the semiconductor substrate layer of the first conductivity type into which the impurity of the second conductivity type is doped is formed so as to surround a region where the impurity is not doped.

2. A method of manufacturing a semiconductor device as claimed in claim 1; wherein the impurity of the second conductivity type is introduced in the specific region of the first conductivity type semiconductor substrate layer such that the region where the impurity is not doped is rectangular.

3. A method of manufacturing a semiconductor device as claimed in claim 1; wherein the impurity of the second conductivity type is introduced in the specific region of the first conductivity type semiconductor substrate layer such that the region where the impurity is not doped is circular.

4. A method of manufacturing a semiconductor device as claimed in claim 2; wherein the impurity of the second conductivity type is introduced in the specific region of the first conductivity type semiconductor substrate layer such that at least two regions where the impurity is not doped are formed.

5. A method of manufacturing a semiconductor device as claimed in claim 4; wherein the impurity of the second conductivity type is introduced in the specific region of the first conductivity type semiconductor substrate layer such that the at least two regions where the impurity is not doped are parallel to each other and spaced apart at regular intervals.

6. A method of manufacturing a semiconductor device as claimed in claim 4; wherein the impurity of the second conductivity type is introduced in the specific region of the first conductivity type semiconductor substrate layer such that the at least two regions where the impurity is not doped are parallel to each other and spaced apart at regular intervals in directions of an X axis and of a Y axis.

7. A method of manufacturing a semiconductor device as claimed in claim 1; wherein the impurity of the second conductivity type is introduced in the specific region of the first conductivity type semiconductor substrate layer such that the region where the impurity is not doped is similar in shape to an emitter region of the bipolar transistor formed in the surface of the epitaxial growth layer of the second conductivity type.

8. A method of manufacturing a semiconductor device as claimed in claim 1; wherein the impurity of the second conductivity type is introduced in the specific region of the first conductivity type semiconductor substrate layer such that the region where the impurity is not doped is positioned vertically below an emitter region of the bipolar transistor formed in the surface of the epitaxial growth layer of the second conductivity type.

9. A method of manufacturing a semiconductor device as claimed in claim 7; wherein the region where the impurity is not doped is larger than the area of the emitter region of the bipolar transistor formed in the surface of the epitaxial growth layer of the second conductivity type.

10. A method of manufacturing a semiconductor device as claimed in claim 4; wherein the region where the impurity is not doped is larger than the area of a base region of the bipolar transistor formed in the surface of the epitaxial growth layer of the second conductivity type.

11. A method of manufacturing a semiconductor device as claimed in claim 1; wherein the impurity of the second conductivity type doped in the specific region of the first conductivity type semiconductor substrate is antimony.

12. A method of manufacturing a semiconductor device as claimed in claim 1; wherein the impurity of the second conductivity type doped in the specific region of the first conductivity type semiconductor substrate is arsenic.

13. A method of manufacturing a semiconductor device as claimed in claim 1; wherein the impurity of the second conductivity type doped in the specific region of the first conductivity type semiconductor substrate is phosphorous.

14. A method of manufacturing a semiconductor device as claimed in claim 3; wherein the impurity of the second conductivity type is introduced in the specific region of the first conductivity type semiconductor substrate layer such that at least two regions where the impurity is not doped are formed.

15. A method of manufacturing a semiconductor device as claimed in claim 4; wherein the impurity of the second conductivity type is introduced in the specific region of the first conductivity type semiconductor substrate layer such that the region where the impurity is not doped is positioned vertically below an emitter region of the bipolar transistor formed in the surface of the epitaxial growth layer of the second conductivity type.

16. A method of manufacturing a semiconductor device as claimed in claim 8; wherein the region where the impurity is not doped is larger than the area of the emitter region of the bipolar transistor formed in the surface of the epitaxial growth layer of the second conductivity type.

17. In a method of manufacturing a semiconductor device, the steps of:

doping an impurity of a second conductivity type in a first region of a first semiconductor layer;

forming a second semiconductor layer on the first semiconductor layer so that there is no intermediate layer between mating surfaces of the first and second semiconductor layers; and forming a semiconductor device in the second semiconductor layer;

wherein the first region of the first semiconductor layer into which the impurity is doped is formed so as to surround a second region of the first semiconductor layer where the impurity is not doped, so that diffusion of the impurity after doping thereof produces a region of the first semiconductor layer having a lower concentration of the impurity in the vicinity of the second region where the impurity is not doped than in surrounding regions of the first semiconductor layer.

18. A method of manufacturing a semiconductor device according to claim 17; wherein the second region of the first semiconductor layer where the impurity is not doped is rectangular in planar shape.

19. A method of manufacturing a semiconductor device according to claim 17; wherein the second region of the first semiconductor layer where the impurity is not doped is circular in planar shape.

20. A method of manufacturing a semiconductor device according to claim 17; wherein the second region comprises at least two separate regions of the first semiconductor layer each being surrounded by the first region.

21. A method of manufacturing a semiconductor device according to claim 20; wherein the at least two separate regions of the second region are parallel to each other.

22. A method of manufacturing a semiconductor device according to claim 17; wherein the semiconductor device formed in the second semiconductor layer comprises a bipolar transistor, and the second region of the first semiconductor layer is aligned with an emitter region of the bipolar transistor.

23. A method of manufacturing a semiconductor device according to claim 22; wherein the second region of the first semiconductor layer is larger than and similar in planar shape to the emitter region of the bipolar transistor.

24. A method of manufacturing a semiconductor device according to claim 22; wherein the second semiconductor layer comprises an epitaxial growth layer formed on the first semiconductor layer.

25. A method of manufacturing a semiconductor device according to claim 22; wherein a collector of the bipolar transistor is formed in the first semiconductor layer.

26. A method of manufacturing a semiconductor device according to claim 17; wherein the second semiconductor layer comprises an epitaxial growth layer formed on the first semiconductor layer.

27. A method of manufacturing a semiconductor device according to claim 17; wherein the first semiconductor layer has a first conductivity type, the impurity has a second conductivity type, and the second semiconductor layer has the second conductivity type.

28. A method of manufacturing a semiconductor device according to claim 17; further comprising the step of diffusing the impurity in the first semiconductor layer after doping thereof.

29. A method of manufacturing a semiconductor device according to claim 17; wherein the step of diffusing the impurity comprises the step of annealing.

30. A method of manufacturing a semiconductor device according to claim 17; wherein the second region of the first semiconductor layer where the impurity is not doped is larger than an area of a base region of a bipolar transistor formed in the surface of the second semiconductor layer.

31. A method of manufacturing a semiconductor device according to claim 17; wherein the impurity comprises antimony.

32. A method of manufacturing a semiconductor device according to claim 17; wherein the impurity comprises arsenic.

33. A method of manufacturing a semiconductor device according to claim 17; wherein the impurity comprises phosphorous.

* * * * *